(12) United States Patent
Dohi et al.

(10) Patent No.: US 8,339,615 B2
(45) Date of Patent: Dec. 25, 2012

(54) EDGE DETECTION METHOD FOR TRANSPARENT SUBSTRATE BY DETECTING NON-LIGHT-EMITTING REGION OF TRANSPARENT SUBSTRATE

(75) Inventors: Masayuki Dohi, Yokohama (JP); Itsuko Sakai, Yokohama (JP); Takayuki Sakai, Chofu (JP); Shunji Kikuchi, Kitakami (JP); Takuto Inoue, Kitakami (JP); Akihiro Hori, Oita (JP); Masayuki Narita, Chigasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 503 days.

(21) Appl. No.: 12/510,591

(22) Filed: Jul. 28, 2009

(65) Prior Publication Data

US 2010/0027032 A1 Feb. 4, 2010

(30) Foreign Application Priority Data

Jul. 29, 2008 (JP) ................................. 2008-195017

(51) Int. Cl.
*G01B 11/00* (2006.01)
*G01N 21/00* (2006.01)
(52) U.S. Cl. .... 356/621; 356/614; 356/433; 250/559.36
(58) Field of Classification Search .................. 356/621, 356/638–640; 250/559.3, 559.36
See application file for complete search history.

(56) References Cited

U.S. PATENT DOCUMENTS

| | | | |
|---|---|---|---|
| 5,115,142 A | 5/1992 | Taguchi et al. | |
| 6,162,008 A | 12/2000 | Perkins et al. | |
| 6,323,954 B1 | 11/2001 | Halter | |
| 6,489,626 B2 | 12/2002 | van der Muehlen et al. | |
| 7,737,426 B2 * | 6/2010 | Takahashi et al. | 250/559.36 |
| 2004/0207836 A1 * | 10/2004 | Chhibber et al. | 356/237.4 |
| 2009/0194865 A1 | 8/2009 | Sekiguchi et al. | |

FOREIGN PATENT DOCUMENTS

| | | |
|---|---|---|
| JP | 2001-108406 | 4/2001 |
| JP | 2005-109376 | 4/2005 |
| JP | 2007-165655 | 6/2007 |

OTHER PUBLICATIONS

Japanese Office Action for Japanese Application No. 2008-195017 mailed on Sep. 4, 2012.

\* cited by examiner

*Primary Examiner* — Gregory J Toatley
*Assistant Examiner* — Rebecca C Bryant
(74) *Attorney, Agent, or Firm* — Turocy & Watson, LLP

(57) ABSTRACT

An edge detection method includes preparing a transparent substrate which includes a first main face having a first main region and a first peripheral region and a second main face having a second main region and a second peripheral region, the first peripheral region having an inclination angle of $\theta a1$ and the second peripheral region having an inclination angle of $\theta a2$, causing measuring light to enter the first peripheral region from a direction perpendicular to the first main region, detecting a non-emitting region where the measuring light is not emitted from the second peripheral region, and detecting an edge of the transparent substrate on the basis of the non-emitting region, wherein if a refractive index of the transparent substrate is n, the inclination angles $\theta a1$ and $\theta a2$ satisfy the following expression:

$$n \times \sin(\theta a1 + \theta a2 - \arcsin(\sin \theta a1/n)) \geq 1.$$

13 Claims, 5 Drawing Sheets

United States Patent US 8,339,615 B2

EDGE DETECTION METHOD FOR TRANSPARENT SUBSTRATE BY DETECTING NON-LIGHT-EMITTING REGION OF TRANSPARENT SUBSTRATE

CROSS-REFERENCE TO RELATED APPLICATIONS

This application is based upon and claims the benefit of priority from prior Japanese Patent Application No. 2008-195017, filed Jul. 29, 2008, the entire contents of which are incorporated herein by reference.

BACKGROUND OF THE INVENTION

1. Field of the Invention

This invention relates to an edge detection method.

2. Description of the Related Art

When the edge of a substrate is detected, if the substrate is opaque, the edge can be detected easily by an optical method. Specifically, when a region including the edge of the substrate is irradiated with measuring light, the measuring light is blocked by the substrate in the region where the substrate exists, with the result that the light does not reach a light detecting part (or a light-receiving part). The edge can be detected by detecting a region where the measuring light does not reach the light detecting part (or a dark region). However, in the case of a transparent substrate, since measuring light passes through the transparent substrate, the dark region cannot be detected. Accordingly, it is not easy to detect the edge of a transparent substrate by an optical method.

To overcome the above problem, a method of beveling the peripheral part of the transparent substrate to form an inclined surface and refracting measuring light at the inclined surface has been proposed (refer to Jpn. Pat. Appln. KOKAI Publication No. 2005-109376). Specifically, since the measuring light is refracted at the inclined surface, producing a dark region, the edge of the transparent substrate can be detected. However, it is difficult to make the width of the dark region sufficiently wide by just refracting the measuring light. This causes the problem of being incapable of detecting the dark region reliably.

In addition, a method of causing measuring light to obliquely enter a transparent substrate to produce a dark region by total internal reflection has been proposed (refer to Jpn. Pat. Appln. KOKAI Publication No. 2007-165655). However, with this method, if the thickness or refractive index of the transparent substrate changes, the measurement system has to be adjusted. For example, when the refractive index of the transparent substrate has changed, the total internal reflection angle has also changed. Therefore, the incident angle of the measuring light has to be changed. It is not easy for the user to make such an adjustment.

As described above, it has been difficult to detect the edge of a transparent substrate easily and reliably by an optical method.

BRIEF SUMMARY OF THE INVENTION

A first aspect of the present invention, there is provided an edge detection method comprising: preparing a transparent substrate which includes a first main face that has a first main region and a first peripheral region outside the first main region and a second main face that has a second main region in parallel with the first main region and a second peripheral region outside the second main region, the first peripheral region having an inclination angle of $\theta a1$ and the second peripheral region having an inclination angle of $\theta a2$; causing measuring light to enter the first peripheral region of the first main face from a direction perpendicular to the first main region of the first main face; detecting a non-emitting region where the measuring light is not emitted from the second peripheral region of the second main face; and detecting an edge of the transparent substrate on the basis of the non-emitting region, wherein if a refractive index of the transparent substrate is n, the inclination angles $\theta a1$ and $\theta a2$ satisfy the following expression:

$$n \times \sin(\theta a1 + \theta a2 - \arcsin(\sin \theta a1/n)) \geq 1$$

A second aspect of the present invention, there is provided an edge detection method comprising: preparing a transparent substrate which includes a first main face that has a first main region and a first peripheral region outside the first main region and a second main face that has a second main region in parallel with the first main region and a second peripheral region outside the second main region, each of the first peripheral region and the second peripheral region having an inclination angle becoming smaller toward the inner part; causing measuring light to enter the first peripheral region of the first main face from a direction perpendicular to the first main region of the first main face; detecting a non-emitting region where the measuring light is not emitted from the second peripheral region of the second main face; and detecting an edge of the transparent substrate on the basis of the non-emitting region.

DETAILED DESCRIPTION OF THE INVENTION

Hereinafter, referring to the accompanying drawings, embodiments of the invention will be explained.

(First Embodiment)

Figure 1:
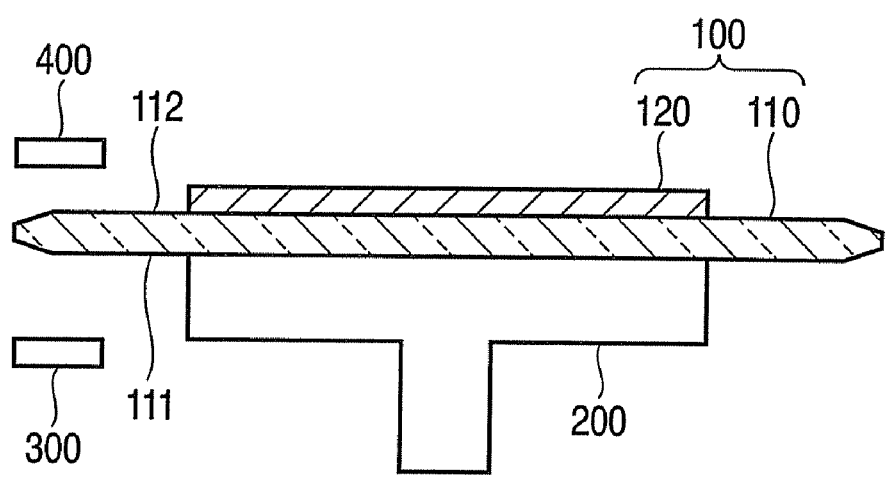
FIG. 1 is a schematic view to explain an edge detection method according to a first and a second embodiment of the invention.
Figure 2:
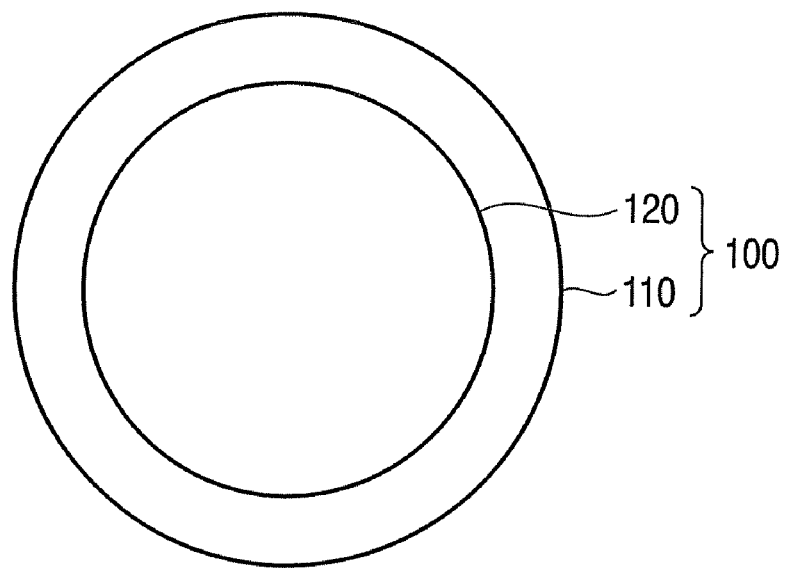
FIG. 2 is a schematic plan view showing the configuration of a substrate to be processed according to the first and second embodiments.
Figure 3:
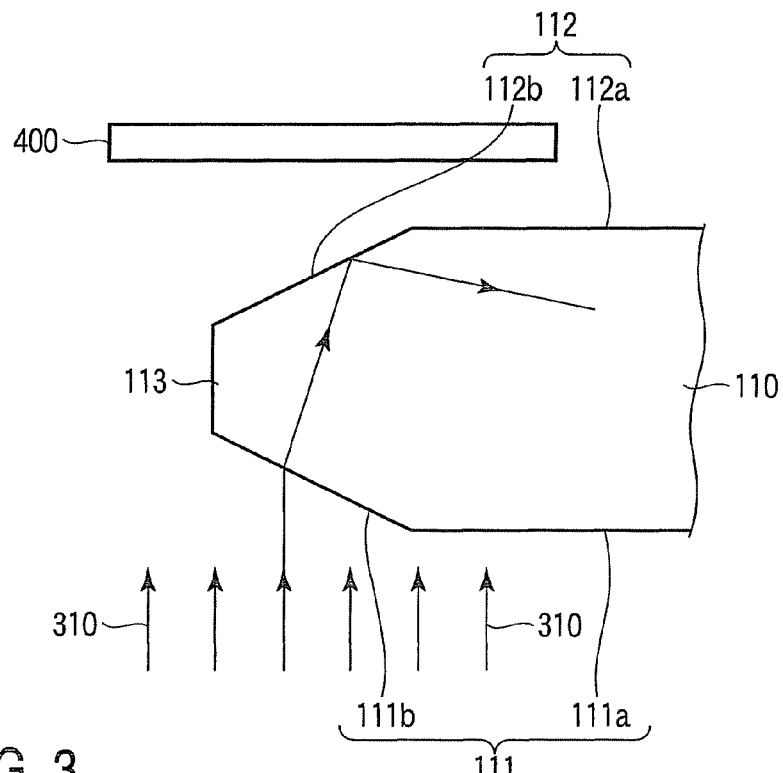
FIG. 3 is a detail view of a part of FIG. 1 according to the first embodiment.

FIG. 1 is a schematic view to explain an edge detection method according to a first embodiment of the invention. FIG. 2 is a schematic plan view showing the configuration of a substrate to be processed shown in FIG. 1. FIG. 3 is a detail view of a part of FIG. 1.

A substrate to be processed 100 is composed of a transparent substrate 110, such as a glass substrate, and a semiconductor substrate (or a semiconductor wafer) 120 provided on the transparent substrate 110. On the semiconductor substrate 120, an element region including active elements and interconnections is provided. In the first embodiment, an image sensor (e.g., a CMOS image sensor) including light-receiving elements and transistors is formed in the element region. The transparent substrate 110 is for securing the mechanical strength of the semiconductor substrate 120 and protecting the element region of the semiconductor substrate 120. The substrate 100 is placed on a stage 200 and can be rotated by the rotation of the stage 200. While the substrate 100 is being rotated, the edge position of the substrate 100 is detected, thereby enabling the center position of the substrate 100 to be determined.

On the side of a first main face 111 of the transparent substrate 110, there is provided a light supplying part 300 composed of a light-emitting part and others. The light-supplying part 300 supplies measuring light for detecting the edge of the transparent substrate 110 to the first main face 111 of the transparent substrate 110. On the side of a second main face 112 of the transparent substrate 110, there is provided a light detecting part 400 composed of a light-receiving part and others. The edge of the transparent substrate 110 can be detected by detecting a dark region where measuring light is not emitted from the second main face 112 of the transparent substrate 110 (or non-emitting region). Hereinafter, the principle of edge detection in the first embodiment will be explained with reference to FIG. 3.

As shown in FIG. 3, the transparent substrate 110 has the first main face 111, the second main face 112, and an end face 113. The first main face 111 has a first main region 111a and a first peripheral region 111b outside the first main region 111a. The second main face 112 has a second main region 112a in parallel with the first main region 111a and a second peripheral region 112b outside the second main region 112a. Each of the first peripheral region 111b and second peripheral region 112b has an oblique plane (inclined surface) produced by a beveling process.

When the edge of the transparent substrate 110 is detected, the measuring light 310 is caused to enter the first peripheral region 111b of the first main face 111 from a direction perpendicular to the transparent substrate 110. That is, the measuring light 310 is caused to enter the first peripheral region 111b from a direction perpendicular to the first main region 111a of the first main face 111 and the second main region 112a of the second main face 112. The measuring light 310 is refracted at the first peripheral region 111b and reaches the second peripheral region 112b of the second main face 112. Here, the inclination angle of each of the first peripheral region 111b and second peripheral region 112b has been set so that the measuring light may reflect totally at the second peripheral region 112b. As a result of the total internal reflection, there appears a non-emitting region where the measuring light is not emitted from the second peripheral region 112b of the second main face 112, that is, a dark region. On the basis of the dark region, the edge (or end face 113) of the transparent substrate 110 can be detected. That is, the edge of the transparent substrate 110 can be detected by detecting a dark region with the light detecting part 400. When a CCD line sensor where pixels are arranged in one direction is used as the light detecting part 400, if a dark region is detected across not less than a specific number of consecutive pixels, the edge is assumed to have been detected. The place corresponding to the boundary between the pixels detecting a bright region (bright signal) and the pixels detecting a dark region (dark signal) is detected as an edge.

Figure 4:
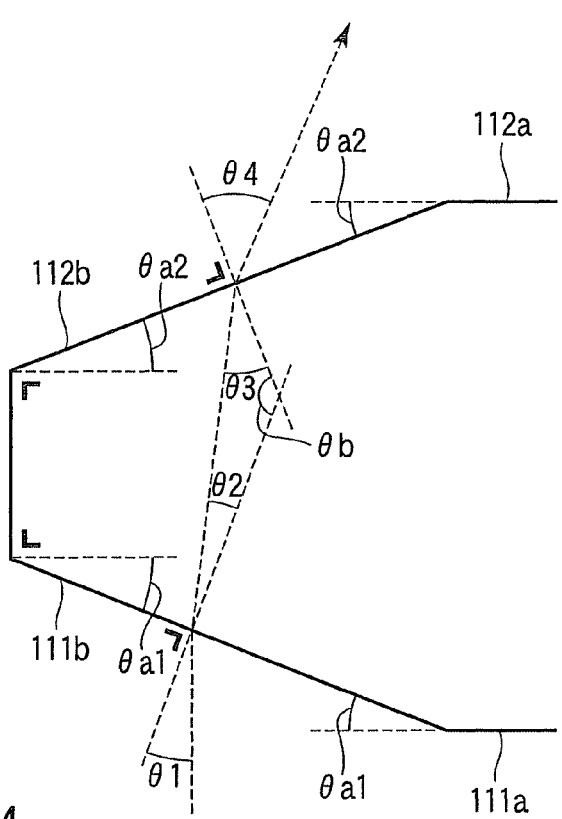
FIG. 4 is a view showing the inclination angle of a peripheral region of a transparent substrate according to the first embodiment.

Hereinafter, the inclination angle of each of the first peripheral region 111b and second peripheral region 112b will be explained with reference to FIG. 4. FIG. 4 shows the vicinity of the edge of the transparent substrate 110.

As shown in FIG. 4, let the inclination angle of the first peripheral region 111b (or the angle defined by the first main region 111a and first peripheral region 111b of the first main face) be $\theta a1$ and the inclination angle of the second peripheral region 112b (or the angle defined by the second main region 112a and second peripheral region 112b of the second main face) be $\theta a2$. In addition, let the incident angle and output angle of the measuring light to the first peripheral region 111b be $\theta 1$ and $\theta 2$, respectively, and the incident angle and output angle of the measuring light to the second peripheral region 112b be $\theta 3$ and $\theta 4$, respectively. Moreover, let the refractive index of the transparent substrate 110 be n.

The refractive index n of the transparent substrate 110 is expressed as:

$$n = \sin \theta 4 / \sin \theta 3$$

When total internal reflection takes place, $\theta 4 = 90$ degrees. Accordingly, if the critical angle at the time when total internal reflection takes place is $\theta c$, it follows that $$n = 1/\sin \theta c$$

Accordingly, $\theta c = \arcsin(1/n)$ (1)

The refractive index n of the transparent substrate 110 is also expressed as:

$$n = \sin \theta 1 / \sin \theta 2$$

Since the incident direction of the measuring light is perpendicular to the first main region 111a, this gives $$\theta 1 = \theta a1$$

Accordingly, it follows that $$\theta 2 = \arcsin(\sin \theta a1/n) \quad (2)$$

If the angle between the normal line of the first peripheral region 111b and the normal line of the second peripheral region 112b is $\theta b$, $\theta b$ is expressed as:

$$\theta b = 360 - 90 - 90 - \theta a1 - \theta a2 \quad (3)$$

Here, $$\theta 3 = 180 - \theta 2 - \theta b \quad (4)$$

Accordingly, from equation (3) and equation (4), $$\theta 3 = \theta a1 + \theta a2 - \theta 2 \quad (5)$$

Substituting equation (2) into equation (5) gives:

$$\theta 3 = \theta a1 + \theta a2 - \arcsin(\sin \theta a1/n) \quad (6)$$

If $\theta c \leq \theta 3$, total internal reflection will take place. Accordingly, from equation (1) and equation (6), it follow that $$\arcsin(1/n) \leq \theta a1 + \theta a2 - \arcsin(\sin \theta a1/n) \quad (7)$$

Accordingly, the condition for the occurrence of total internal reflection is:

$$n \times \sin(\theta a1 + \theta a2 - \arcsin(\sin \theta a1/n)) \geq 1 \quad (8)$$

Here, let the left side of expression (8) be an index value A.

Figure 5:
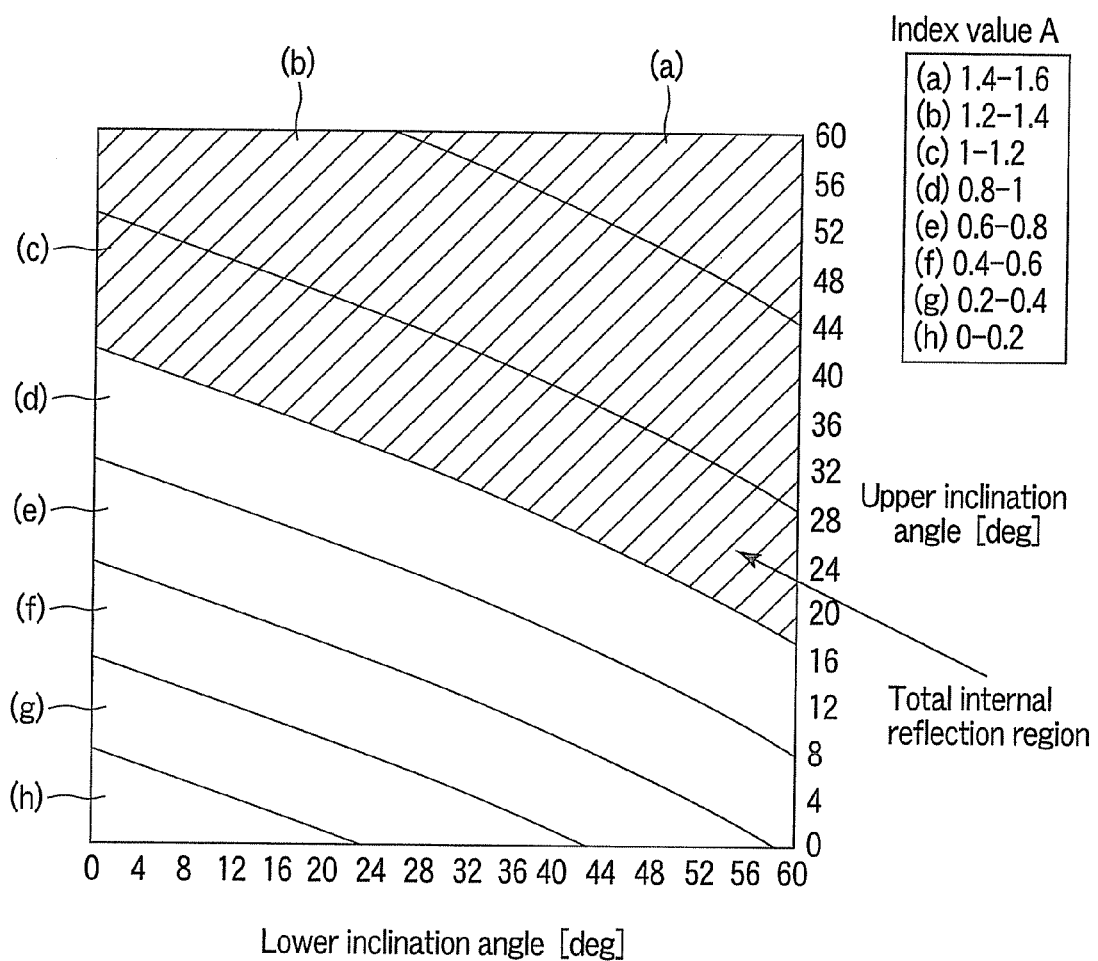
FIG. 5 is a diagram showing the result of calculating a region where total internal reflection takes place in the first embodiment.

FIG. 5 shows the result of calculating a range where total internal reflection takes place using expression (8). In FIG. 5, the refractive index n of the transparent substrate 110 is 1.5. The abscissa axis indicates a lower inclination angle (or inclination angle $\theta a1$ of the first peripheral region 111b). The ordinate axis indicates an upper inclination angle (inclination angle $\theta a2$ of the second peripheral region 112b). The shaded regions (a), (b), and (c) represent a range where total internal reflection will take place.

Figure 6:
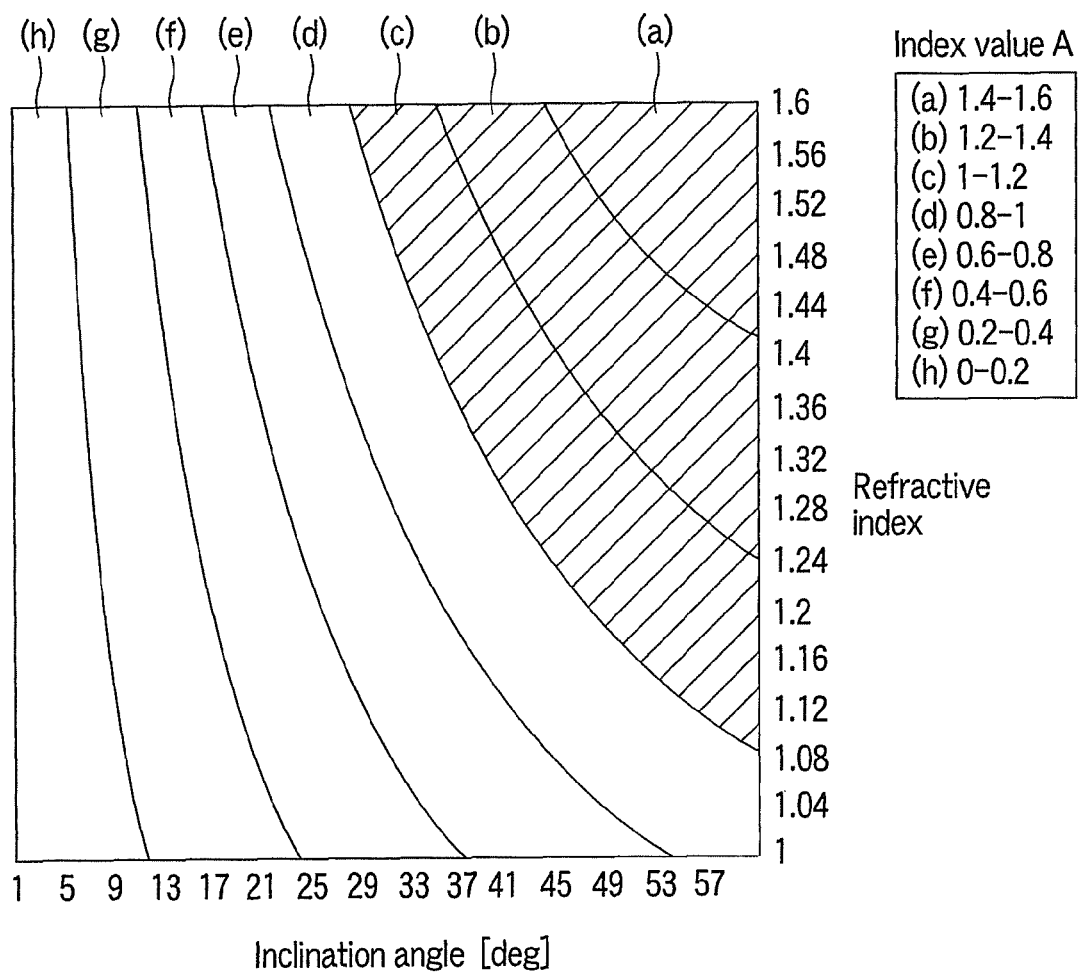
FIG. 6 is a diagram showing the result of calculating a region where total internal reflection takes place in the first embodiment.

FIG. 6 also shows the result of calculating a range where total internal reflection takes place using expression (8). However, FIG. 6 is based on the assumption that inclination angle θa1 of the first peripheral region 111b is equal to inclination angle θa2 of the second peripheral region 112b. The abscissa axis indicates inclination angles θa1 and θa2. The ordinate axis indicates the refractive index n of the transparent substrate 110. The shaded regions (a), (b), and (c) represent a range where total internal reflection will take place.

As described above, in the first embodiment, each of the first peripheral region 111b and second peripheral region 112b of the transparent substrate 110 is configured to have an oblique plane and both inclination angle θa1 of the first peripheral region 111b and inclination angle θa2 of the second peripheral region 112b are set so as to fulfill expression (8). This enables the measuring light entering the first peripheral region 111b to totally reflect at the second peripheral region 112b. As a result, the width of the non-emitting region (or dark region) where the measuring light is not emitted from the second peripheral region 112b can be increased sufficiently. Accordingly, the dark region can be detected reliably and therefore the edge of the transparent substrate can be detected reliably. Moreover, in the first embodiment, setting inclination angles θa1 and θa2 so as to fulfill expression (8) makes it unnecessary to change the incident angle of the measuring light even if the thickness or refractive index of the transparent substrate 110 has changed and therefore make a complicated adjustment work. Therefore, according to the first embodiment, the edge of the transparent substrate can be detected easily and reliably by the optical method.

From the viewpoint of ease of beveling, it is desirable that inclination angle θa1 of the first peripheral region 111b should be made equal to inclination angle θa2 of the second peripheral region 112b and that the first peripheral region 111b and second peripheral region 112b should be symmetrical vertically with respect to the center plane of the transparent substrate 110. However, inclination angle θa1 may be different from the inclination angle θa2, provided that expression (8) is fulfilled. In addition, either inclination angle θa1 or inclination angle θa2 may be 0 degree. In this case, one of the first peripheral region 111b and second peripheral region 112b has no oblique plane, but can produce the same effect as described above, provided that expression (8) is fulfilled.

Next, in the first embodiment, the upper limit of the inclination angle θ (θ=θa1=θa2) will be explained in a case where inclination angle θa1 of the first peripheral region 111b is equal to inclination angle θa2 of the second peripheral region 112b.

Figure 7:
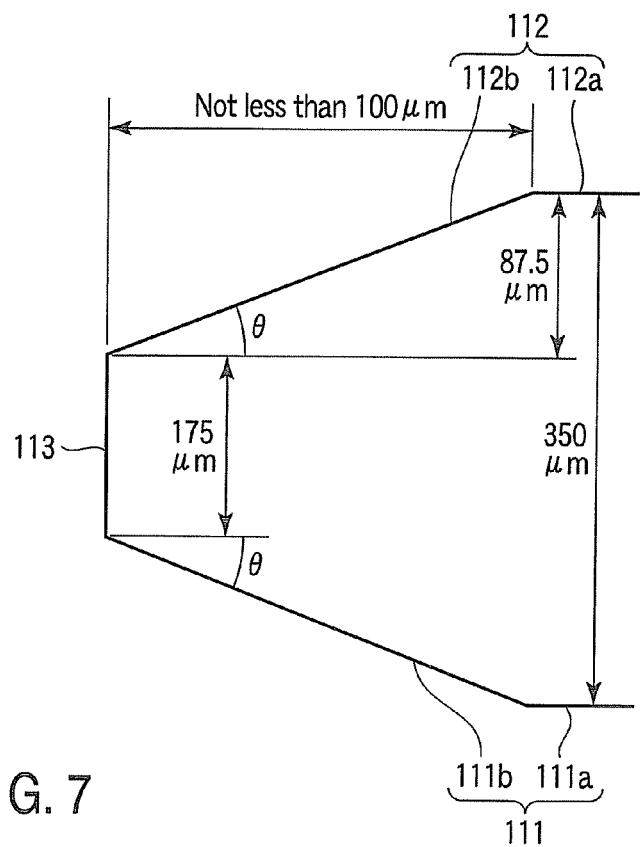
FIG. 7 is a diagram for calculating the upper limit of the inclination angle in the first embodiment.

FIG. 7 shows typical dimensions of various parts to calculate the upper limit of the inclination angle θ. The transparent substrate has a standard thickness of 350 μm. To secure the mechanical strength at the peripheral part of the transparent substrate, the thickness of the end face 113 is not less than ½ of the thickness (350 μm) of the transparent substrate. The size of one pixel of the line sensor constituting the light detecting part is 20 μm. The condition for detecting an edge is that a dark region is detected across not less than five consecutive pixels, that is, the width of a dark region is not less than 100 μm.

Calculating the upper limit of the inclination angle θ under the above condition gives $$\tan\theta = 87.5/100$$

Accordingly, it follows that $$\theta = \arctan(87.5/100) = 41.2 \text{ degrees}$$

That is, the upper limit of the inclination angle θ is preferably about 41 degrees.

(Second Embodiment)

Next, an edge detection method according to a second embodiment of the invention will be explained. Since the basic configuration and method are the same as those of the first embodiment, what has been explained in the first embodiment will be omitted.

Figure 8:
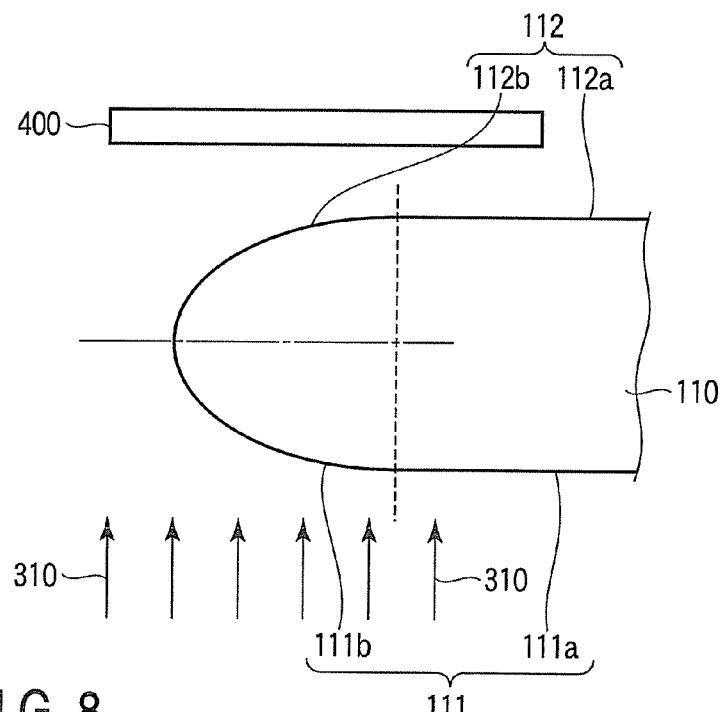
FIG. 8 is a detail view of a part of FIG. 1 in the second embodiment of the invention.

FIG. 8 is a detail view of a part of FIG. 1. Hereinafter, referring to FIG. 8, the principle of edge detection in the second embodiment will be explained.

As shown in FIG. 8, a transparent substrate 110 has a first main face 111 and a second main face 112. The first main face 111 has a first main region 111a and a first peripheral region 111b outside the first main region 111a. The second main face 112 has a second main region 112a in parallel with the first main region 111a and a second peripheral region 112b outside the second main region 112a. The inclination of the first peripheral region 111b and that of the second peripheral region 112b become gentler toward the center of the transparent substrate 110. That is, the inclination angle of the first peripheral region 111b and that of the second peripheral region 112b become smaller toward the inner part of the substrate. In the example of FIG. 8, each of the first peripheral region 111b and second peripheral region 112b has a curved surface as a result of beveling. The first peripheral region 111b and second peripheral region 112b are symmetrical vertically with respect to the center plane of the transparent substrate 110.

When the edge of the transparent substrate 110 is detected, measuring light 310 is caused to enter the first peripheral region 111b of the first main face 111 from a direction perpendicular to the transparent substrate 110 as in the first embodiment. That is, the measuring light 310 is caused to enter the first peripheral region 111b from a direction perpendicular to the first main region 111a of the first main face 111 and to the second main region 112a of the second main face 112. The measuring light 310 is refracted at the first peripheral region 111b and reaches the second peripheral region 112b of the second main face 112. Since the inclination of the second peripheral region 112b becomes gentler toward the center of the substrate, total internal reflection can be caused to take place in a wide range of the second peripheral region 112b. As a result of the total internal reflection, a non-emitting region where the measuring light is not emitted from the second peripheral region 112b of the second main face 112, or a dark region, is produced as in the first embodiment. On the basis of the dark region, the edge (or end part) of the transparent substrate 110 can be detected. That is, by detecting the dark region with the light detecting part 400, the edge of the transparent substrate 110 can be detected. When a CCD line sensor composed of pixels arranged in one direction is used as the light detecting part 400, if a dark region is detected across not less than a specific number of pixels, the edge is assumed to have been detected. The place corresponding to the boundary between the pixels that have detected a bright region (bright signal) and the pixels that have detected a dark region (dark signal) is detected as an edge.

As described above, in the second embodiment, since the inclination angle of each of the first peripheral region 111b and second peripheral region 112b of the transparent substrate 110 becomes smaller toward the inner part of the substrate, the thickness of the transparent substrate 110 at the peripheral part can be secured sufficiently (or the mechanical strength can be secure sufficiently) and total internal reflection can be caused to take place in a wide range of the second peripheral region 112b. As a result, the width of the non-emitting region (dark region) where the measuring light is not emitted from the second peripheral region 112b can be increased sufficiently, which enables the dark region to be detected reliably. Even when the thickness or refractive index of the transparent substrate 110 has changed, the incident angle of the measuring light need not be changed and therefore a complicated adjustment work need not be done. Therefore, according to the second embodiment, the edge of the transparent substrate can be detected easily and reliably by the optical method.

While in the example of FIG. 8, each of the first peripheral region 111b and second peripheral region 112b has a curved surface, the shape of the curved surface is not limited. For example, the curved surface may take various forms, including a circular form, an elliptical form, and a hyperbolic form.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An edge detection method comprising:
preparing a transparent substrate which includes a first main face that has a first main region and a first peripheral region outside the first main region and a second main face that has a second main region in parallel with the first main region and a second peripheral region outside the second main region, the first peripheral region having an inclination angle of $\theta a1$ and the second peripheral region having an inclination angle of $\theta a2$;
causing measuring light to enter the first peripheral region of the first main face from a direction perpendicular to the first main region of the first main face;
detecting a non-emitting region where the measuring light is not emitted from the second peripheral region of the second main face; and
detecting an edge of the transparent substrate on the basis of the non-emitting region,
wherein preparing the transparent substrate includes adjusting the inclination angles $\theta a1$ and $\theta a2$ so as to satisfy the following expression, where n is a refractive index of the transparent substrate:

$n \times \sin(\theta a1 + \theta a2 - \arcsin(\sin \theta a1/n)) \geq 1$.

2. The method according to claim 1, wherein the inclination angle $\theta a1$ and inclination angle $\theta a2$ are equal to each other.

3. The method according to claim 1, wherein the measuring light reflects totally at the second peripheral region.

4. The method according to claim 1, wherein the first main face or the second main face has a semiconductor substrate mounted thereon.

5. The method according to claim 1, wherein the transparent substrate is placed on a rotatable stage.

6. The method according to claim 1, wherein the first peripheral region and second peripheral region are subjected to beveling.

7. The method according to claim 1, wherein the non-emitting region is detected with a line sensor.

8. An edge detection method comprising:
preparing a transparent substrate which includes a first main face that has a first main region and a first peripheral region outside the first main region and a second main face that has a second main region in parallel with the first main region and a second peripheral region outside the second main region, the first peripheral region having an inclination angle of $\theta a1$ and the second peripheral region having an inclination angle of $\theta a2$;
causing measuring light to enter the first peripheral region of the first main face from a direction perpendicular to the first main region of the first main face, wherein the measuring light reflects totally at the second peripheral region;
detecting a non-emitting region where the measuring light is not emitted from the second peripheral region of the second main face; and
detecting an edge of the transparent substrate on the basis of the non-emitting region,
wherein if a refractive index of the transparent substrate is n, the inclination angles $\theta a1$ and $\theta a2$ satisfy the following expression:

$n \times \sin(\theta a1 + \theta a2 - \arcsin(\sin \theta a1/n)) \geq 1$.

9. The method according to claim 8, wherein the inclination angle $\theta a1$ and inclination angle $\theta a2$ are equal to each other.

10. The method according to claim 8, wherein the first main face or the second main face has a semiconductor substrate mounted thereon.

11. The method according to claim 8, wherein the transparent substrate is placed on a rotatable stage.

12. The method according to claim 8, wherein the first peripheral region and the second peripheral region are subjected to beveling.

13. The method according to claim 8, wherein the non-emitting region is detected with a line sensor.

* * * * *